United States Patent
Sandner et al.

(10) Patent No.: US 9,312,760 B2
(45) Date of Patent: Apr. 12, 2016

(54) SWITCHED-MODE POWER CONVERTER WITH SPLIT PARTITIONING

(71) Applicant: Infineon Technologies Austria AG, Villach (AT)

(72) Inventors: Christoph Sandner, Villach (AT); Roman Riederer, Villach (AT); Josef Höglauer, Kirchheim (DE); Stephan Auer, Dachau (DE)

(73) Assignee: Infineon Technologies Austria AG, Villach (AT)

( * ) Notice: Subject to any disclaimer, the term of this patent is extended or adjusted under 35 U.S.C. 154(b) by 165 days.

(21) Appl. No.: 14/108,096

(22) Filed: Dec. 16, 2013

(65) Prior Publication Data

US 2015/0171748 A1 Jun. 18, 2015

(51) Int. Cl.
*G05F 1/10* (2006.01)
*H02M 3/156* (2006.01)
*H02M 1/00* (2007.01)

(52) U.S. Cl.
CPC ........... *H02M 3/156* (2013.01); *H01L 2224/18* (2013.01); *H01L 2924/13055* (2013.01); *H02M 2001/0009* (2013.01); *H03K 2217/0027* (2013.01); *H03K 2217/0081* (2013.01)

(58) Field of Classification Search
CPC ................. H01L 2924/00; H01L 2924/00014; H01L 2924/73265; H01L 2924/13091; H01L 2924/48247
See application file for complete search history.

(56) References Cited

U.S. PATENT DOCUMENTS

| | | | |
|---|---|---|---|
| 5,714,767 A * | 2/1998 | Nakamura et al. | 257/39 |
| 6,020,729 A | 2/2000 | Stratakos et al. | |
| 6,462,522 B2 | 10/2002 | Burstein et al. | |
| 2002/0071293 A1 * | 6/2002 | Eden et al. | 363/20 |
| 2012/0133348 A1 * | 5/2012 | Fan et al. | 323/284 |
| 2013/0200869 A1 * | 8/2013 | Sasao et al. | 323/282 |
| 2014/0252484 A1 * | 9/2014 | Loechelt et al. | 257/355 |
| 2014/0346569 A1 * | 11/2014 | Vielemeyer et al. | 257/195 |

OTHER PUBLICATIONS

"I2C Controlled 4.5A Single Cell USB/Adapter Charger With Narrow VDC Power Path Management and USB OTG," Texas Instruments Production Data Sheet, SLUSAW5A, Jan. 2012—Revised Oct. 2012, 46 pp.

* cited by examiner

*Primary Examiner* — Sibin Chen
(74) *Attorney, Agent, or Firm* — Shumaker & Sieffert, P.A.

(57) ABSTRACT

A power converter is described that includes components arranged within a first die and a second die of a single package. The first die includes one or more first switches coupled to a switching node of a power stage. The second die includes one or more second switches coupled to the switching node of the power stage, a feedback control unit configured to detect a current level at the one or more second switches of the power stage, and a controller unit configured to control the one or more first switches and the one or more second switches of the power stage based at least in part on the current level detected by the feedback control unit.

19 Claims, 6 Drawing Sheets

SWITCHED-MODE POWER CONVERTER WITH SPLIT PARTITIONING

TECHNICAL FIELD

This disclosure relates to power converters, and more particular, to techniques and circuits associated with switched-mode power converters.

BACKGROUND

Some circuits may use power converters that receive a power input from a power source and convert (e.g., step-up or step-down) the power input to a power output that has a different (e.g., regulated) voltage or current level than the voltage or current level of the power input. The converter outputs the power output to a filter for powering a component, a circuit, or other electrical device. Switch-based power converters may use half-bridge circuits and signal modulation techniques to regulate the current or voltage level of a power output. In some examples, power converters may use additional feedback control circuits and techniques (e.g., voltage sensing, current sensing, and the like) to improve the accuracy and control of the voltage or current level of the power output. These aforementioned techniques and circuits for improving the accuracy and control of the voltage or current of the power output may decrease overall efficiency of the power converter and/or increase the physical size, complexity, and/or cost of the power converter.

SUMMARY

In general, techniques and circuits are described for enabling a system in package (SiP) power converter to output power with a current level that can not only reach or exceed five amperes, but also can be contained within a narrow (e.g., accurate) current-level tolerance window, all without sacrificing the package size, cost, and/or efficiency of the SiP power converter. A SiP power converter, whether a step-down or step-up converter, may include one or more power switches, driver/control logic, and feedback control circuitry (e.g., current sensing circuitry) distributed across only two dies of the SiP power converter package. One die is a CMOS (Complementary Metal Oxide Semiconductor) type die and the other die is a FET (Field Effect Transistor) or SFET (Superconductor Field Effect Transistor) type die. The one or more power switches of the SiP power converter comprise a power stage (e.g., a single phase half-bridge, a multi-phase half-bridge, etc.). Some of the one or more power switches (e.g., either the low-side or the high-side the half-bridge of the half-bridge of the power stage) are located on the one FET or SFET type die, while the rest of the one or more power switches (e.g., the side of the half-bridge of the power stage that is not on the FET or SFET type die), are located on the other CMOS type die. The other CMOS type die further includes all the driver/control logic and the feedback control circuitry (e.g., current sensing circuitry).

By containing some of the one or more power switches to the one FET or SFET type die, the efficiency of the SiP power converter can be improved since at least a portion (e.g., the high-side) of the power stage of the SiP power converter can include high-efficiency FET or SFET type power switches. Additionally, by co-locating the driver/control logic, the feedback control circuitry (e.g., the current sensing circuitry), and the rest (e.g., the low-side) of the one or more power switches to the one CMOS type die, the accuracy of the power output of the SiP power converter can be improved since the power output can be controlled using highly accurate sense-FET current sensing circuitry without being susceptible to electromagnetic interference (EMI) and other noise caused by switching of the FET or SFET type switches. Furthermore by operating the current sensing circuitry on the same CMOS die as the rest of the power switched and driver/control logic, the current sensing circuitry can operate without using a charge pump.

In one example, the disclosure is directed to a power converter including a first die including one or more first switches coupled to a switching node of a power stage, and a second die. The second die includes one or more second switches coupled to the switching node of the power stage, a feedback control unit configured to detect a current level at the one or more second switches of the power stage, and a controller unit configured to control the one or more first switches and the one or more second switches of the power stage based at least in part on the current level detected by the feedback control unit.

In another example, the disclosure is directed to a method that includes detecting, by a feedback control unit at a second die of a power converter, a current level at one or more second switches at the second die of the power converter, the one or more second switches being coupled to one or more first switches at a first die of the power converter at a switching node of a power stage. The method further includes controlling, by a controller unit at the second die, the one or more first switches of the power stage at the first die based at least in part on a driver signal, wherein the driver signal is based at least in part on the current level detected at the one or more second switches at the second die. The method further includes controlling, by the controller unit at the second die, the one or more second switches of the power stage at the second die based at least in part on the driver signal.

In another example, the disclosure is directed to a power converter having means for means for detecting a current level at one or more second switches at a second die of a power converter, the one or more second switches being coupled to one or more first switches at a first die of the power converter at a switching node of a power stage. The power converter further includes means for controlling, from the second die, the one or more first switches of the power stage at the first die based at least in part on a driver signal, wherein the driver signal is based at least in part on the current level detected at the one or more second switches at the second die. The power converter further includes means for controlling, from the second die, the one or more second switches of the power stage at the second die based at least in part on the driver signal.

The details of one or more examples are set forth in the accompanying drawings and the description below. Other features, objects, and advantages of the disclosure will be apparent from the description and drawings, and from the claims.

DETAILED DESCRIPTION

Figure 1:
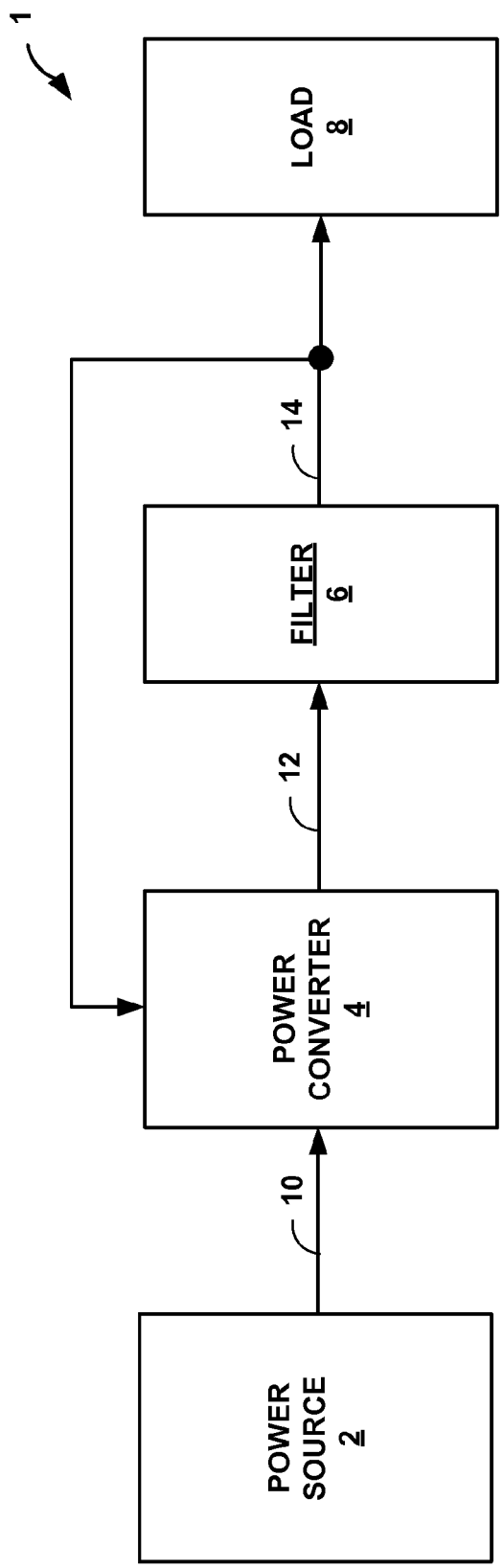
FIG. 1 is a block diagram illustrating an example system for converting power from a power source, in accordance with one or more aspects of the present disclosure.

In some applications, a switch-based power converter (hereafter referred to as a "power converter" or simply a "converter") may receive a power input and convert (e.g., by stepping-up or stepping-down) the power input to a power output that has a voltage or current level that is different (e.g., regulated) than the voltage or current level of the power input, for instance, to provide the power output to a filter for powering a load (e.g., a device). As described herein, the term "step-up" refers to a power converter configured to receive an input power signal with a first voltage level, and output a power signal with a second voltage level that is greater than the first voltage level. As also described herein, the term "step-down" converter refers to a power converter configured to receive an input power signal with a first voltage level, and output a power signal with a second voltage level that is less than the first voltage level.

In either case, a power converter may have one or more switches (e.g., MOS power switch transistors based switches, gallium nitride (GaN) based switches, or other types of switch devices) arranged in a power stage configuration (e.g., a single phase, or multi-phase half-bridge configuration, etc.) that the power converter controls, according to one or more modulation techniques, to change the current or voltage level of the power output. A single phase half-bridge may include a high-side switch coupled to a low-side switch at a switching node whereas a multi-phase half-bridge may include multiple high-side switches coupled to multiple low-side switches at a switching node.

A power converter may include one or more gate drivers and control logic to control (e.g., turn-on and turn-off) the one or more switches of the power stage using modulation techniques. Such modulation of the switches of a power stage may operate according to pulse-density-modulation (PDM), pulse-width-modulation (PWM), pulse-frequency-modulation (PFM), or another suitable modulation technique. By controlling the switches of a power stage using modulation techniques, a power converter can regulate the current or voltage level of the power being outputted by the power converter.

Some power converters may use feedback circuits and techniques for performing current sensing and/or voltage sensing to obtain information about a current or voltage level of a power output. The power converter may use the information received using feedback circuits and techniques to improve the accuracy of the power output. For example, the power converter may use the feedback information to contain the voltage or current level of a power output within a particular tolerance or threshold window for satisfying the power requirements of a load. Some power converters may use current sensing as one example of feedback circuits and techniques to determine the real-time current level of the power being outputted to a load. If the power converter determines that the current level does not satisfy the power requirements of the load, then the power converter may adjust or change how the power converter controls the power switches in order to adjust or change the current level of the power output until the current level of the power output is contained within the tolerance window and satisfies the current level associated with the power requirements of the load.

Some power converters have individual and discrete high-side and low-side power switches that are separate from the driver/control logic and/or feedback control circuitry of the power converter. A power converter that uses individual and discrete power switches may operate with less efficiency than some other types of power converters. For instance, a "System in Package" or "SiP" power converter may have a higher level of efficiency than a power converter that uses individual and discrete power switches.

Rather than rely on individual and discrete power switches, a SiP power converter includes power switches that are integrated with driver/control logic and feedback control circuitry into a single integrated circuit (IC) or chip package. While integrated packaging may cause SiP power converters to operate with greater efficiency than other types of power converters, the integrated packaging may increase complexity and/or cost associated with the design and manufacturing of the power converter. As a result of higher complexity and costs, a SiP power converter may be unsuitable (e.g., too complex and/or too costly) for certain low-cost and less complex power converter applications.

Although the components of the SiP are contained in a single package, the size of the SiP packaging may cause the SiP power converter to be too large for some applications. For example, a SiP power converter may have one or more dies (e.g., of CMOS type) that include all the driver/control logic and feedback control circuitry of the power converter as well as two or more other dies (e.g., of FET type, of SFET type, etc.) that each include one or more high-side and low-side high-efficiency (e.g., FET, SFET, etc.) power switches. As such, a SiP power converter may include a minimum of three separate and individual dies within the single integrated circuit or chip package. The resultant size, complexity, and cost to design and manufacture a SiP power converter may be proportionate to the quantity of dies included in the SiP. By including three, and often more than three, individual dies within a single integrated circuit or chip package, the complexity, cost, and/or size of the SiP converter may exceed the corresponding complexity, cost, and/or size requirements of the application of the SiP power converter.

Although some SiP power converters may include integrated feedback control circuitry for performing on-chip current and/or voltage sensing, in some instances, the integrated feedback control circuitry of a SiP power converter may obtain inaccurate information about a current or voltage level of a power output since. The inaccuracies of integrated feedback control (e.g., sensing) circuitry of a SiP power converter may be due to an increased susceptibility that sense lines of integrated feedback control (e.g., sensing) circuitry may have to operating noise (e.g., during a switching cycle when the power switches of the SiP power converter transitions between operating in an on-state and an off-state).

For example, a SiP power converter may co-locate the driver/control logic and the feedback control circuitry onto a single CMOS type die. The SiP power converter may further co-locate the high-side power switches onto a first FET or SFET type die and the low-side power switches onto a second FET or SFET type die. By separating the feedback control circuitry from the power switches, the SiP power converter may require additional sense lines (e.g., wires or traces) arranged in-between the CMOS type die and one or both of the two FET or SFET type dies for coupling the feedback control (e.g., sensing) circuitry to the power switches.

Sense lines that are located outside of the die that contains the feedback control circuitry, and that are arranged in-between two separate dies of an integrated circuit or chip package, may be susceptible to electromagnetic interference (EMI) or other type of electrical noise, especially when high-efficiency FET or SFET power switches are used and caused to transition between operating in an on-state and an off-state (e.g., turn-on or turn-off) during a switching cycle. In addition, when performing particular types of sensing or feedback control techniques (e.g., current sense-FET current sensing) at a one side of a half-bridge (e.g., the low-side), a large (e.g., high capacitance) charge pump may be required by the feedback control (e.g., sensing) circuitry to obtain accurate information associated with the current level of a power output.

In some examples, to minimize the effects that noise may have on the sensing circuitry of a power converter, a "System on Chip" or "SoC" power converter with monolithic integration may be used. The SoC power converter integrates the driver/control logic and feedback control circuitry of the power converter, with the power switches of the power converter, onto a single die within the same chip or package. By integrating all the power switches, the driver/control logic, and the feedback control circuitry onto a single die, the sense lines of the feedback control circuitry is also contained within the single die and may be less susceptible to EMI or other electrical noise and obtain more accurate information about the current and/or voltage level of a power output than the sensing circuitry used by some other power converters.

Although a SoC power converter with monolithic integration may have improved sensing circuitry, a SoC power converter may be less efficient that some other power converters because the power switches of a SoC power converter may dissipate a greater amount of power during each switching cycle (e.g., each transition between operating in an on-state and an off-state) than the amount of power lost to a switching cycle by the power switches of some other power converters. For example, rather than use more efficient FET or SFET power switch technology, a SoC power converter may use less efficient CMOS switching technology that can be co-located onto the same (e.g., CMOS) die as the driver/control logic and integrated current sensing.

The less efficient power switch technology of the SoC power converter may have a higher amount of $R_{DS(ON)}$ than the power switches of other power converters. As a result of a higher amount of $R_{DS(ON)}$, the power switches of a SoC power converter may dissipate a greater amount of power during each switching cycle than the amount of power lost during each switching cycle of the power switches power converters that have switches with a lower amount of $R_{DS(ON)}$ (e.g., FET or SFET type switches). In addition, the CMOS type switches of the SoC power converter may limit the current level of the SoC power output to less than five amperes.

In general, circuits and techniques of this disclosure may enable a system in package (SiP) power converter to output power with a current level that can not only reach or exceed five amperes, but also can be contained within a narrow (e.g., accurate) current-level tolerance window, all without sacrificing the package size, cost, and/or efficiency of the SiP power converter. A SiP power converter, whether a step-down or step-up converter, may include one or more power switches, driver/control logic, and feedback control circuitry (e.g., current sensing circuitry) distributed across only two dies of the SiP power converter package. One die is a CMOS type die and the other die is a FET or SFET type die. The one or more power switches of the SiP power converter comprise a power stage (e.g., a half-bridge). Some of the one or more power switches (e.g., either the low-side or the high-side a half-bridge of the power stage) are located on the one FET or SFET type die, while the rest of the one or more power switches (e.g., the side of the half-bridge of the power stage that is not on the FET or SFET type die), are located on the other CMOS type die. The other CMOS type die further includes all the driver/control logic and the feedback control circuitry (e.g., current sensing circuitry).

Throughout this disclosure the terms "CMOS type" and "FET or SFET type" are used to describe two different types or forms of semiconductor dies for use in implementing the circuits and techniques described herein. A CMOS type die as referred to herein describes a semiconductor die that includes primarily CMOS type transistors, or that the semiconductor die is primarily manufactured according to a CMOS type manufacturing process, or that the semiconductor die includes substantially more CMOS type transistors than other types of transistors. A FET or SFET type die as referred to herein describes a semiconductor die that includes primarily FET or SFET type transistors (e.g., rather than CMOS type transistors that may be primarily found in a CMOS type die), or that the semiconductor die is primarily formed by a FET or SFET type manufacturing process (e.g., rather than a CMOS type manufacturing process that may be used to form a CMOS type die), or that the semiconductor die includes substantially more FET or SFET type transistors than other types of transistors (e.g., CMOS type).

By containing some of the one or more power switches to the one FET or SFET type die, at least a portion (e.g., the high-side) of the power stage of the SiP power converter can include high-efficiency FET or SFET type power switches. Additionally, co-locating the driver/control logic, the current sensing circuitry, and the rest (e.g., the low-side) of the one or more power switches to the one CMOS type die allows the SiP power converter to be controlled using highly accurate sense-FET current sensing circuitry without further requiring a charge pump for the sense-FET current sensing circuitry. Furthermore, by co-locating the rest of the one or more power switches, the current sensing circuitry, and the driver/control logic to a single die, electromagnetic interference (EMI) or other noise disturbances (e.g., caused by switching of the FET or SFET type switches on the FET or SFET type die) at the sense lines of the current sensing circuitry may be reduced.

In this way, by using high efficient FET or SFET type power switches for at least some of the power switches of the SiP power converter, the SiP power converter according to the following circuits and techniques can operate more efficiently, and can output power at greater current levels, than some SoC and other SiP power converters. Furthermore, by containing current sensing circuitry to the same die as the driver/control logic and the rest of the power switches of the SiP power converter, the SiP power converter according to the following circuits and techniques can be controlled using highly accurate (e.g., sense-FET) current sensing technology, without requiring a charge pump, to provide a more accurate power output that has a current level contained to a narrow tolerance window. Additionally, because a charge pump is not necessary, and since only two dies are used, the SiP power converter can fit within a smaller, less complex, and cheaper package than some larger, more complex, and more expensive SoC and SiP power converters.

FIG. 1 is a block diagram illustrating system 1 for converting power from power source 2, in accordance with one or more aspects of the present disclosure. FIG. 1 shows system 1 as having four separate and distinct components shown as power source 2, power converter 4, filter 6, and load 8, however system 1 may include additional or fewer components. For instance, power source 2, power converter 4, filter 6, and load 8 may be four individual components or may represent a combination of one or more components that provide the functionality of system 1 as described herein.

System 1 includes power source 2 which provides electrical power to system 1. Numerous examples of power source 2 exist and may include, but are not limited to, power grids, generators, transformers, batteries, solar panels, windmills, regenerative braking systems, hydro-electrical or wind-powered generators, or any other form of devices that are capable of providing electrical power to system 1.

System 1 includes power converter 4 which operates as a switch-based power converter that converts one form of electrical power provided by power source 2 into a different, and usable form, of electrical power for powering load 8. Power converter 4 may be a step-up converter that outputs power with a higher voltage level than the voltage level of input power received by the step-up converter. One example of such step-up converter may be referred to as a boost converter. Power converter 4 may instead comprise a step-down converter configured to output power with a lower voltage level than the voltage level of input power received by the step-down converter. One example of such a step-down converter may be referred to as a buck converter. In still other examples, power converter 4 may be a step-up and step-down converter (e.g., a buck-boost converter) that is capable of outputting power with a voltage level that is higher or lower level than the voltage level of the power input received by the step-up and step-down converter. Examples of power converter 4 may include battery chargers, microprocessor power supplies, and the like. Power converter 4 may operate as a DC-to-DC, DC-to-AC or AC-to-DC converter.

System 1 further includes filter 6 and load 8. Load 8 receives the electrical power (e.g., voltage, current, etc.) converted by power converter 4 after the power passes through filter 6. In some examples, load 8 uses the filtered electrical power from power converter 4 and filter 6 to perform a function. Numerous examples of filter 6 exist and may include, any suitable electronic filter for filtering power for a load. Examples of filter 6 include, but are not limited to, passive or active electronic filters, analog or digital filters, high-pass, low-pass, band pass, notch, or all-pass filters, resistor-capacitor filters, inductor-capacitor filters, resistor-inductor-capacitor filters, and the like. Likewise, numerous examples of load 8 exist and may include, but are not limited to, computing devices and related components, such as microprocessors, electrical components, circuits, laptop computers, desktop computers, tablet computers, mobile phones, batteries, speakers, lighting units, automotive/marine/aerospace/train related components, motors, transformers, or any other type of electrical device and/or circuitry that receives a voltage or a current from a power source.

Power source 2 may provide electrical power with a first voltage or current level over link 10. Load 8 may receive electrical power that has a second voltage or current level, converted by power converter 4, and filtered through filter 6, over link 14. Links 10, 12, and 14 represent any medium capable of conducting electrical power from one location to another. Examples of links 10, 12, and 14 include, but are not limited to, physical and/or wireless electrical transmission mediums such as electrical wires, electrical traces, conductive gas tubes, twisted wire pairs, and the like. Each of links 10 and 12 provide electrical coupling between, respectively, power source 2 and power converter 4, and power converter 4 and filter 6. Link 14 provides electrical coupling between filter 6 and load 8. In addition, link 14 provides a feedback loop or circuit for carrying information to power converter 4 associated with the characteristics of a filtered power output from filter 6.

In the example of system 1, electrical power delivered by power source 2 can be converted by converter 4 to power that has a regulated voltage and/or current level that meets the power requirements of load 8. For instance, power source 2 may output, and power converter 4 may receive, power which has a first voltage level at link 10. Power converter 4 may convert the power which has the first voltage level to power which has a second voltage level that is required by load 8. Power converter 4 may output the power that has the second voltage level at link 12. Filter 6 may receive the power from converter 4 and output the filtered power that has the second voltage level at link 14.

Load 8 may receive the filtered power that has the second voltage level at link 14. Load 8 may use the filtered power having the second voltage level to perform a function (e.g., power a microprocessor). Power converter 4 may receive information over link 14 associated with the filtered power that has the second voltage level. For instance, feedback control (e.g., current sensing) circuitry of power converter 4 may detect the voltage or current level of the filtered power output at link 14 and driver/control logic of converter 4 may adjust the power output at link 12 based on the detected voltage or current level to cause the filtered power output to have a different voltage or current level that fits within a voltage or current level tolerance window required by load 8.

Figure 2:
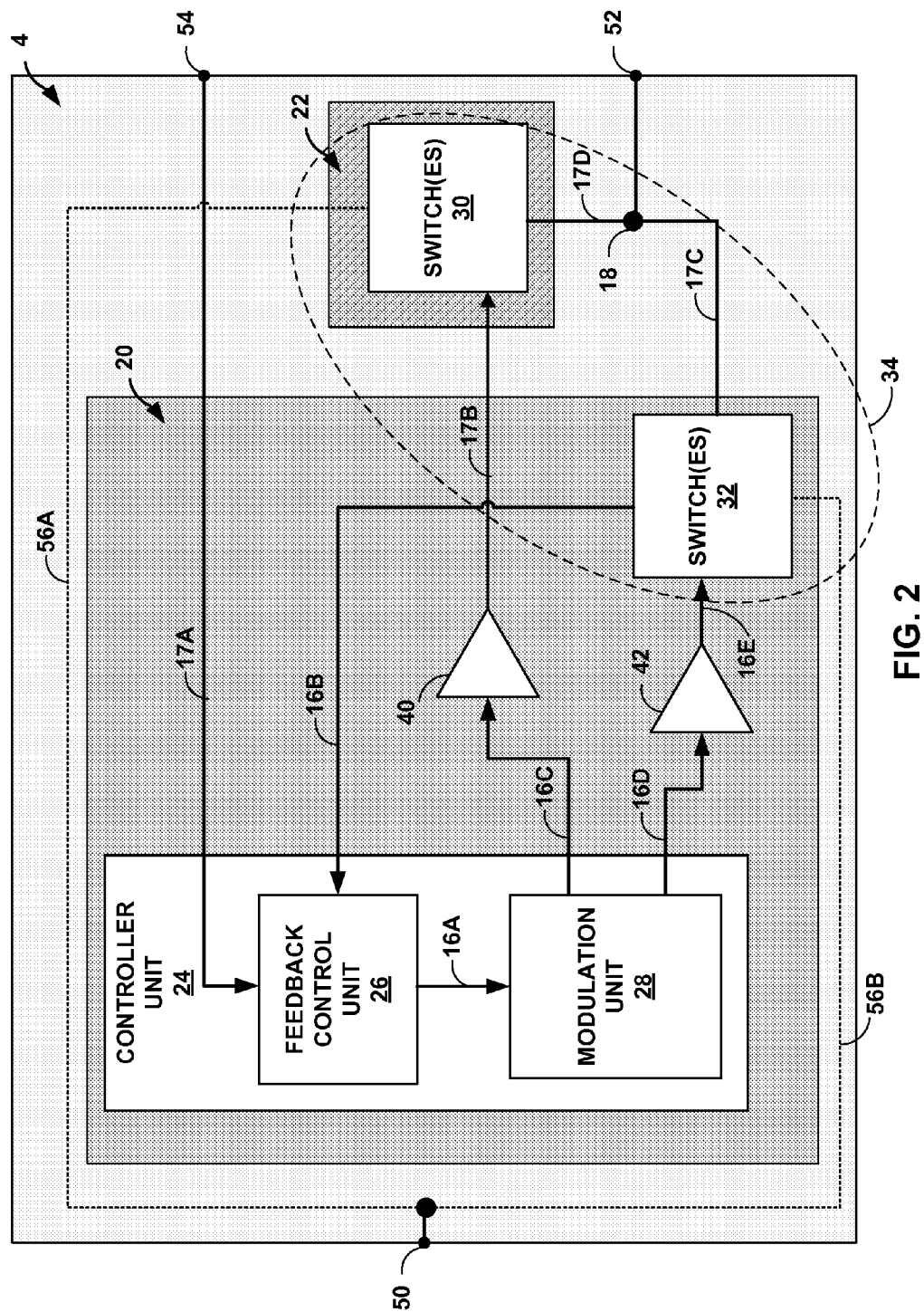
FIG. 2 is a block diagram illustrating one example of a power converter of the example system shown in FIG. 1.

FIG. 2 is a block diagram illustrating one example of power converter 4 of system 1 shown in FIG. 1. For instance, FIG. 2 shows a more detailed exemplary view of power converter 4 of system 1 from FIG. 1 and the electrical connections to power source 2, filter 6, and load 8, provided by links 10, 12, and 14 respectively.

Power converter 4 is shown as being a switch-based SiP power converter having various electrical components and traces (e.g., links or wires) that are co-located within a single, integrated circuit or chip package. The various electrical components and traces of power converter 4 are distributed across two separate dies of converter 4, labeled as die 20 and die 22. Power converter 4 may be a step-up converter (e.g., boost converter), a step-down converter (e.g., buck converter), or a step-up and step-down converter (e.g., a buck-boost converter).

An elliptical dashed line is drawn in FIG. 2 to illustrate the various components of power stage 34 of power converter 4 including one or more switches 30 of die 22 which are coupled to one or more switches 32 of die 22 at switching node 18. Switches 30 may be high-side or low-side switches of a half-bridge of power stage 34, a full-bridge of power stage 34, or any other type of power stage configuration that for outputting power from a switch based power converter. If switches 30 are high-side switches of power stage 34, then switches 32 are low-side switches of power stage 34. Conversely, if switches 30 are low-side switches of power stage 34, then switches 32 are high-side switches of power stage 34.

In the example of FIG. 2, die 20 includes controller unit 42, driver 40, and driver 42 that represent the driver/control logic and feedback control circuitry of power converter 4. Die 20 further includes one or more switches 32 which represent one half (e.g., the low-side or the high-side) of power stage 34 of converter 4. Die 22 of converter 4 does not include any of the driver/control logic or feedback control circuitry of power converter 4. Die 22 does include one or more switches 30 which represent the other half (e.g., the high-side or low-side) of power stage 34 of converter 4 that is omitted from die 20.

In some examples, die 20 and die 22 may include additional or fewer components than the components shown in FIG. 2. For instance, die 22 may include over-current protection circuitry that may require placement at a FET or SFET type die (e.g., die 22) and may not be compatible with placement at a CMOS type die (e.g., die 20). In other words, FET or SFET type components that require placement at a FET or SFET type die can be co-located with switches 32 at die 22.

Die 22 may be a FET or SFET type die and the various components contained within die 22 may be of FET or SFET type. For instance, switches 30 may be one or more FET or SFET type switches. Die 22 may include various other FET or SFET type electrical components not shown in FIG. 2. As FET or SFET type switches, switches 30 may be highly efficient switch devices that perform either the high-side or low-side switching operations of converter 4. For instance, switches 30 may be a single GaN based switch arranged in a single phase half-bridge configuration of power stage 34 with switches 32 and switching node 18. Switches 30 may also be multiple GaN based switches arranged in a multi-phase half-bridge configuration of power stage 34 with switches 32 and switching node 18. In any event, switches 30 may have a lower $R_{DS(ON)}$ than some other types of switches and as a result dissipate less energy during a switching cycle (e.g., when transitioning from operating in an off-state and an on-state) than other, less efficient, type switches.

Die 20 may be a CMOS type die and the various electrical components contained within die 20 may be of CMOS type. For example, die 20 includes controller unit 24, drivers 40 and 42, and one or more switches 32. Controller unit 24 includes modulation unit 28 (e.g., a driver/control logic block) and feedback control unit 26 (e.g., feedback control circuitry). Switches 32 of die 20 may perform the switching operations of converter 4 that are not performed by switches 30 of die 22. Said differently, in cases where switches 30 of die 22 perform low-side switching operations for power stage 34, switches 32 of die 20 may perform high-side switching operations for power stage 34. Conversely, switches 32 of die 20 may perform low-side switching operations for power stage 34 when switches 30 of die 22 perform high-side switching operations.

Switches 32 of die 20 may be single or multiple CMOS type switch devices for performing the switching operations of power stage 34 that are not performed by switches 30 of die 20. As CMOS type switch devices, switches 32 of die 20 may operate less efficiently than other types of switches. For example, switches 32 may have a higher $R_{DS(ON)}$ than some other types of switches (e.g., FET or SFET type switches 30 of die 22) and as a result dissipate more energy during a switching cycle (e.g., when transitioning from operating in an off-state and an on-state) than other, more efficient, type switches.

Power converter 4 includes three terminals for connecting converter 4 to external devices using links 10, 12, and 14. Power converter 4 includes input/output terminals 50 and 52 and feedback terminal 54. Feedback terminal 54 may be coupled to link 14 of FIG. 1 for providing feedback information indicative of voltage or current level of the filtered power output being provided out of filter 6, across link 14, to load 8.

Depending on the particular configuration of converter 4, input/output terminal 52 couples switching node 18 to either link 10 or link 12. For example, when power converter 4 operates as a step-down or buck converter, input/output terminal 52 acts as an output and couples switching node 18 to link 12. Conversely, when power converter 4 operates as a step-up or boost converter, input/output terminal 52 acts as an input and couples switching node 18 to link 10. When power converter 4 operates as a step-up and step-down converter, power converter 4 includes additional switching logic (not shown) for causing input/output terminals 50 and 52 to operate as either input or output terminals. In addition, depending on the particular configuration of converter 4, input/output terminal 50 couples switches 30, via link 56A, to either link 10 or link 12, or input/output terminal 52 couples switches 32, via link 56B, to either link 10 or link 12.

For example, in one example, switches 30 are high-side switches of a half-bridge of power stage 34 and switches 32 are low-side switches of a half-bridge of power stage 34. When power converter 4 operates as a step-down or buck converter, input/output terminal 50 acts as an input and couples link 10 to high-side switches 30 via link 56A. Conversely, when power converter 4 operates as a step-up or boost converter, input/output terminal 50 acts as an output and couples link 12 to high-side switches 30 via link 56A.

In an alternative example, switches 32 are high-side switches of a half-bridge of power stage 34 and switches 30 are low-side switches of a half-bridge of power stage 34. When power converter 4 operates as a step-down or buck converter, input/output terminal 50 acts as an input and couples link 10 to high-side switches 32 via link 56B. Conversely, when power converter 4 operates as a step-up or boost converter, input/output terminal 50 acts as an output and couples link 12 to high-side switches 32 via link 56B.

In either example, when operating as a step-down converter, power converter 4 may receive a power input over link 10 from source 2 at input/output terminal 50. Power converter 4 may control switches 30 and 32 according to modulation techniques to convert the power input to a power output that has a lower voltage level than the power input. Power converter 4 may output the power output to filter 6 across link 12 at input/output terminal 52. Conversely, when operating as a step-up converter, power converter 4 may receive a power input over link 10 from source 2 at input/output terminal 52. Power converter 4 may control switches 30 and 32 according to modulation techniques to convert the power input to a power output that has a higher voltage level than the power input. Power converter 4 may output the power output to filter 6 across link 12 at input/output terminal 50. In either example, when power converter 4 operates as a step-up and step-down converter, power converter 4 includes additional switching logic (not shown) for causing input/output terminals 50 and 52 to operate as either input or output terminals.

Links 16A-16E (collectively "links 16") represent various "internal" traces and/or vias of die 20 that electrically couple and interconnect the internal components 24, 26, 28, 40, 42, and 32 contained within die 20. For example, link 16A provides a path for electrical information to pass between feedback control unit 26 and modulation unit 28 within controller unit 24. Link 16B represents a sense line between switches 32 and (e.g., current sense-FET current sensing circuitry of) feedback control unit 26. Links 16C and 16D are driver control lines for transmitting driver control signals (e.g., based on pulse-density-modulation (PDM) signal, a pulse-width-modulation (PWM) signal, pulse-frequency-modulation (PFM) signal or other suitable modulation technique) from controller unit 24 to drivers 40 and 42. Link 16E represents a switch control line for transmitting switch control signals from driver 42 to one or more switches 32.

Links 17A-17D (collectively "links 17") represent "external" traces and/or vias that electrically couple or connect components from one die 20 or 22 to feedback terminal 54, switching node 18, and/or the internal components of another die 20 or 22. For example, link 17A couples feedback terminal 54 to feedback control unit 26 of controller unit 24 of die 20 for transmitting information associated with the characteristics of a filtered power output provided by filter 6 at link 14. Link 17B represents a switch control line for transmitting switch control signals from driver 40 of die 22 to one or more switches 30 of die 20. Links 17C and 17D couple one or more switches 32 of die 22 to one or more switches 30 of die 20 at switching node 18 and input/output terminal 52.

Many examples of one or more switches 30 exists and could be any type of switch devices that can be contained to a CMOS type die and further, when arranged in a power stage configuration, are suitable for stepping-down/bucking or stepping-up/boosting a voltage level of a power input. For instance, some examples of one or more switches 30 may include Silicon (Si), Gallium Nitride (GaN), and/or Silicon Carbide (SiC) based switching devices, normally-on or normally-off type switches, GaN high-electron-mobility transistors (HEMT), N-type MOSFET based switch devices, P-type MOSFET based switch devices, diodes, IGBT switch devices, drain extended MOS (deMOS) switch devices, or any other type of power switch transistors or switch device that can operate in a power stage configuration at a CMOS type die.

Likewise, many examples of one or more switches 32 exists and could be any type of switch devices that can be contained to a FET or SFET type die and further, when arranged in a power stage configuration are suitable for stepping-down/bucking or stepping-up/boosting a voltage level of a power input. For instance, some examples of one or more switches 32 may include Si, GaN, and/or Silicon Carbide SiC based switching devices, normally-on or normally-off type switches, HEMT (GaN), FET (GaN), diodes, JFETs (SiC, normally on or off), vertical or lateral type switch devices, metal-gate switch devices, poli-Si-gate switch devices, or any other type of power switch transistors or switch device that can operate in a power stage configuration at a FET or SFET type die.

Driver(s) 40 and driver(s) 42 represent one or more individual gate drivers for controlling each of the one or more individual switches 30 and 32 (respectively). For ease of description, FIG. 2 is described as if each of driver(s) 40 and 42 are each single drivers for controlling each of the one or more individual switches 30 and 32. However, in some examples, driver(s) 40 and 42 each represent an array of multiple drivers, with each driver of the array of drivers 40 being used to control a different respective one of the one or more switches 30, and each driver of the array of drivers 42 being used to control a different respective one of the one or more switches 32.

Driver 40 is coupled to the one or more switches 30 via link 17B such that an output signal produced by driver 40 may cause the one or more switches 30 to transition from operating between an on-state and an off-state (e.g., turn-on or turn-off). Driver 42 is coupled to the one or more switches 32 via link 16E such that an output signal produced by driver 42 may cause the one or more switches 32 to transition from operating between an on-state and an off-state. Driver 40 and 42 each receive driver control signals from modulation unit 28 of controller unit 24 via links 16C and 16D respectively. An output of driver 40 may be based on a driver control signal received via link 16C and an output of driver 42 may be based on a driver control signal received via link 16D.

Controller unit 24 of die 20 represents a combination of driver/control logic and feedback control circuitry of converter 4 for performing modulation and feedback techniques to control drivers 40 and 42 for causing switches 30 and 32 to modulate and to output power at link 12. Controller unit 24 can comprise any suitable arrangement of hardware, software, firmware, or any combination thereof, to perform the techniques attributed to controller unit 24 herein. For example, controller unit 24 may include digital circuitry, analog circuitry, or any combination thereof to control and regulate a switch mode power converter. Controller unit 24 may include any one or more microprocessors, signal processors, application specific integrated circuits (ASICs), field programmable gate arrays (FPGAs), comparators, operational amplifiers, full-custom and/or semi-custom digital logic, registers for storing control data (e.g., parameters), analog and/or digital filter stages, non-linear control blocks, or any other equivalent, integrated, digital or analog circuitry, as well as any combinations of such components.

When controller unit 24 includes software or firmware, controller unit 24 further includes hardware for storing and executing the software or firmware, such as one or more digital or analog processors or processing units. In general, a processing unit may include one or more microprocessors, signal processors, ASICs, FPGAs, comparators, operational amplifiers, or any other equivalent, integrated, digital or analog circuitry, as well as any combinations of such components. Although not shown in FIG. 2, controller unit 24 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to controller unit 24 and/or power converter 4, e.g., may be external to a package in which controller unit 24 and/or power converter 4 is housed.

Controller unit 24 may rely on feedback control unit 26 to detect the voltage or current level of a power output at link 14 and to detect or "sense" the amount of current at power stage 34. For example, feedback control unit 26 may include sense-FET current sensing circuitry, voltage sensing circuitry, or other types of current or voltage sensing circuitry for sensing a current or voltage level via link 16B through switches 32 and power stage 34. Because link 16B is contained internally within die 20, feedback control unit 26 can determine a highly accurate measurement of current at power stage 34. In other words, because feedback control unit 26 does not rely on "external" sense lines that pass between two or more separate dies of converter 4, the sense lines of feedback control unit 26 (e.g., link 16B) are less susceptible to EMI or other noise interference. As a result, the state of the information that feedback control unit 26 receives over link 16B arrives from switches 32 intact and unaltered as compared to state of the information when the information is first transmitted.

By co-locating feedback control unit 26 and switches 32 within the same CMOS die 20, the sensing circuitry of feedback control unit 26 may perform current and/or voltage sensing without the need for a high-capacitance (e.g., large) charge pump required by some other sensing circuitry and techniques. In other words, feedback control unit 26 can perform current sensing, in particular, sense-FET current sensing, at CMOS type switches 32 to determine the level of current at power stage 34 without using a high-capacitance charge pump that may be required by other SoC or SiP power converters.

Controller unit 24 may rely on modulation unit 28 to generate driver control signals (e.g., based on pulse-density-modulation (PDM) signal, a pulse-width-modulation (PWM) signal, pulse-frequency-modulation (PFM) signal or other suitable modulation technique) for controlling the turn-on and/or turn-off signals to switches 30 and 32 of power stage 34 to cause converter 4 to provide a power output at link 12. For example, modulation unit 28 may receive information from feedback control unit 26 adjusting a voltage or current level of a power output, and based on the adjustment information, modulation unit 28 may vary the properties or characteristics of the driver control signals that modulation unit 28 outputs to drivers 40 and 42.

Modulation unit 28 may provide PWM-based driver control signals over links 16C and 16D that cause drivers 40 and 42 to cause switches 30 and 32 of power stage 34 to transition between operating in an on-state and an off state. In response to the voltage or current level of a power output detected at link 14 by feedback control unit 26, and further responsive to the current level at power stage 34 detected by feedback control unit 26, modulation unit 28 may vary the duty cycle of the PWM-based driver signals. For instance, modulation unit 28 and feedback control unit 26 may use current and/or voltage level thresholds to determine an adjustment to the duty cycle of the PWM-based driver signals that control switches 30 and 32 for modulating a particular power output within a particular current or voltage level tolerance window, at link 12. By varying the duty cycle of the PWM-based driver signals based on information detected by feedback control unit 26, modulation unit 28 may alter the level of voltage or current of the power output provided by converter 4 at link 12.

Modulation unit 28 may provide PDM-based driver control signals over links 16C and 16D that cause drivers 40 and 42 to cause switches 30 and 32 of power stage 34 to transition between operating in an on-state and an off state. In response to the voltage or current level of a power output detected at link 14 by feedback control unit 26, and further responsive to the current level at power stage 34 detected by feedback control unit 26, modulation unit 28 may vary the average value of the PDM-based driver signals. For instance, modulation unit 28 and feedback control unit 26 may use current and/or voltage level thresholds to determine an adjustment to the duty cycle of the PDM-based driver signals that control switches 30 and 32 for modulating a particular power output within a particular current or voltage level tolerance window, at link 12. By varying the average value of the PDM-based driver signals based on information detected by feedback control unit 26, modulation unit 28 may alter the level of voltage or current of the power output provided by converter 4 at link 12.

By containing switches 30 to die 22, at least a portion (e.g., the high-side or low-side) of power stage 34 can operate using high-efficiency FET or SFET type power switches without interfering with current or voltage sensing techniques performed by feedback control unit 26 of controller unit 24 of die 20. Additionally, by co-locating controller unit 24, drivers 40 and 42, and switches 32 to die 20, controller unit 24 can control switches 30 and 32 using information obtained from highly accurate sense-FET current sensing circuitry of feedback control unit 26 without further requiring a charge pump for the sense-FET current sensing circuitry of feedback control unit 26. Furthermore, co-locating switches 32 together with feedback control unit 26, modulation unit 28, and drivers 40 and 42 on a single die 20, minimizes the amount of EMI and other noise disturbances, caused during the switching of switches 30 of die 22, at the sense lines (e.g., link 16B) of the current sensing circuitry of feedback control unit 26.

By using high efficient FET or SFET type power switches for at least some of the power switches of a power stage (e.g., including a single phase half-bridge, a multi-phase half-bridge, etc.), the power converter according to these circuits and techniques may operate more efficiently, and can output power at greater current levels, than some SoC and other SiP power converters. Furthermore, by containing current feedback control circuitry to the same die as driver/control logic, and the rest of the power switches of the power stage, the power converter according to these circuits and techniques can be controlled using more accurate (e.g., sense-FET) current sensing technology, without requiring a charge pump, to provide a more accurate power output that has a current level contained to a narrow tolerance window. Additionally, because a charge pump is not necessary, and since only two dies are used, the power converter according to these circuits and techniques can fit within a smaller, less complex, and cheaper package than some larger, more complex, and more expensive SoC and SiP power converters.

In some examples, controller unit 24 does not include feedback control unit 26 and therefore does not perform voltage or current sensing at switches 32. In addition, without feedback control unit 26, controller unit 24 does not control switches 30 and switches 32 based on the voltage or current detected by feedback control unit 26. In some examples, switches 30 may be a diode. For instance, where converter 4 acts as a boost converter, and switches 30 of power stage 34 represent the high-side switches of converter 4, switches 30 may be a single or multiple diodes.

Figure 3:
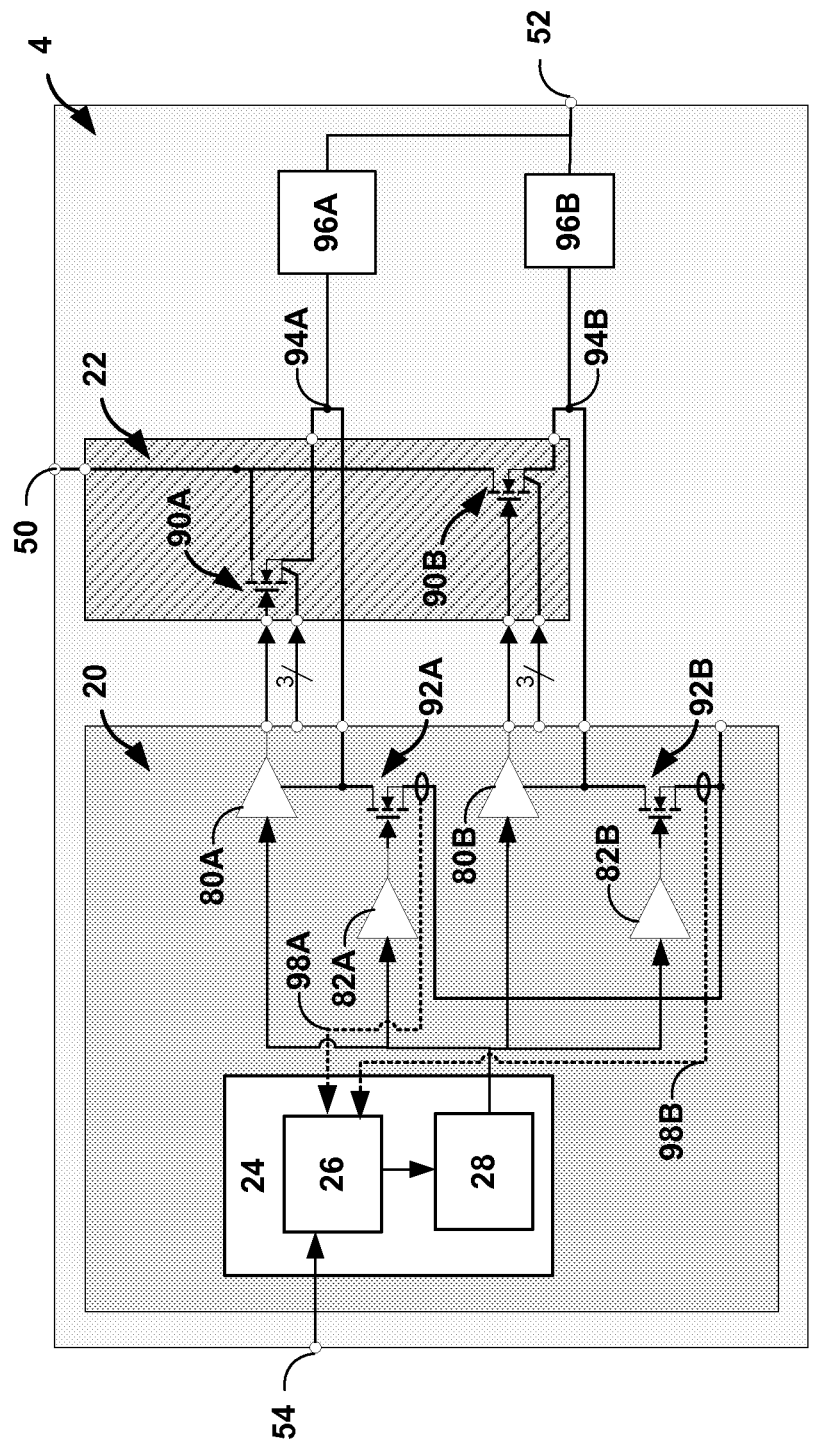
FIG. 3 is a block diagram illustrating one other example of a power converter of the example system shown in FIG. 1.

FIG. 3 is a block diagram illustrating one other example of power converter 4 of system 1 shown in FIG. 1. FIG. 3 is described below within the context power converter 4 of FIG. 2 and system 1 of FIG. 1.

Converter 4 is described within the context of being a multi-phase half-bridge based step-down or step-up converter. Converter 4 of FIG. 3 includes feedback terminal 54 for coupling converter 4 to link 14 and input/output terminals 50 and 52 for coupling converter 4 to links 10 and 12.

Converter 4 includes CMOS type die 20 and FET or SFET type die 22. Die 22 includes SFET type high-side switches 90A and 90B. Die 20 includes controller unit 24, feedback control unit 26, and modulation unit 28. In addition, die 20 includes high-side drivers 80A and 80B for controlling SFET type high-side switches 90A and 90B of die 22 as well as drivers 82A and 82B for controlling CMOS type low-side switches 92A and 92B contained within die 20.

SFET type high-side switch 90A is coupled to CMOS type low-side switch 92A at switching node 94A. SFET type High-side switch 90B is coupled to CMOS type low-side switch 92B at switching node 94B. Filter 96A is arranged between switching node 94A and input/output terminal 52 and filter 96B is arranged between switching node 94B and input/output terminal 52. In some examples, filters 96A and 96B are inductor-capacitor (LC) based filters. In some examples, filters 96A and 96B may be outside of the packaging of converter 4, for instance, as part of filter 6 of FIG. 1. In some examples, filters 96A and 96B may be co-located within die 20 or die 22.

Sense-FET current sensing circuitry of feedback control unit 26 may receive information associated with a detected current level at CMOS type low-side switches 92A and 92B via sense lines 98A and 98B contained within die 20. By containing sense lines 98A and 98B to the interior of die 20, the information transmitted via sense lines 98A and 98B may be less susceptible to EMI or other noise caused during switching operations of SFET type high-side switches 90A and 90B. In addition, by co-locating CMOS type low-side switches 92A and 92B with feedback control unit 26 at die 20, the sense-FET current sensing circuitry of feedback control unit 26 may perform current sensing without requiring a large (e.g., high-capacitance) charge pump. Converter 4 may obtain the benefit of operating more efficiently by using SFET type high-side switches 90A and 90B to die 20, while also using highly accurate current sensing techniques to output power at link 12 that has a current level that fits within a narrow current level tolerance window required by load 8.

In the example of FIG. 3, high-side switches 90A and 90B are contained to SFET die 22. The example of FIG. 3 further illustrates that an optional current sense circuitry (indicated by the 3-wires arranged between the CMOS die 20 and the SFET die 22). Low-side switches 92A and 92B are integrated in CMOS die 20 along with feedback control unit 26 that performs current sensing using integrated sense-MosFets on CMOS die 20.

Figure 4:
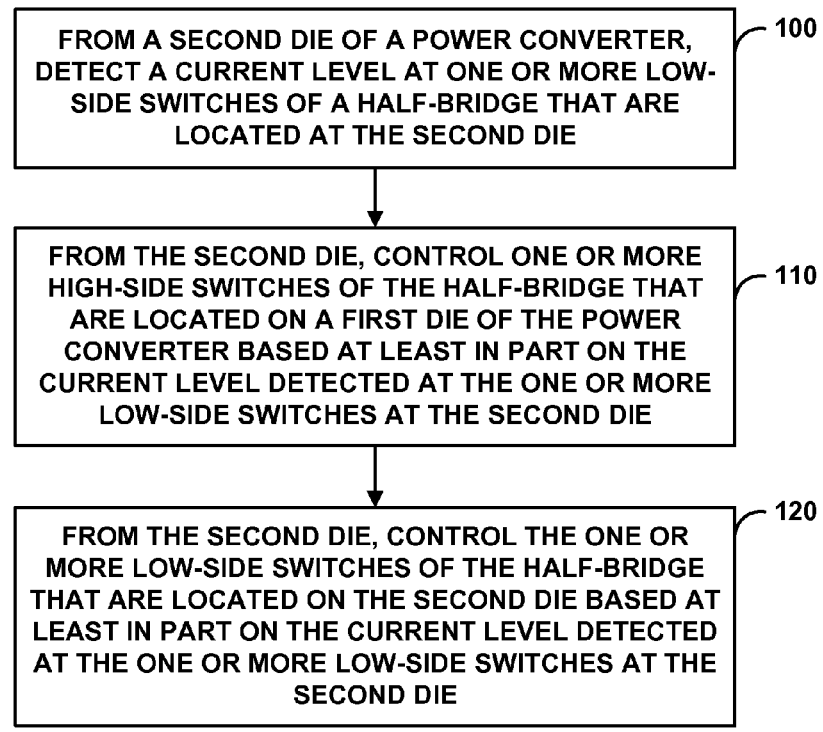
FIG. 4 is a flowchart illustrating example operations of an example power converter, in accordance with one or more aspects of the present disclosure.

FIG. 4 is a flowchart illustrating example operations of an example power converter, in accordance with one or more aspects of the present disclosure. FIG. 5 is described below within the context of power converter 4 of FIG. 2 and system 1 of FIG. 1.

From die 20, power converter 4 may detect a current level at one or more switches 32 of a half-bridge of power stage 34 that are located at die 20. For example, feedback control unit 26 of controller unit 24 located at die 20 of power converter 4 may detect a current level switches 32. The current level may be received by feedback control unit 26 via link 16B (e.g., one or more sense lines connecting switches 32 to sense-FET current sensing circuitry of feedback control unit 26). In some examples, the current level detected at the one or more switches 32 is detected based on a sense-FET current sensing signal received by feedback control unit 26 over one or more current sense lines contained to die 20. The one or more current sense lines may be arranged between feedback control unit 26 at die 20 and the one or more switches 32 at die 20.

From die 20, power converter 4 may control one or more switches 30 of the half-bridge of power stage 34 that are located on die 22 of power converter 4 based at least in part on the current level detected at switches 32 at die 20. For example, feedback control unit 26 may send information indicative of the current level at power stage 34 detected by sense-FET current sensing circuitry of feedback control unit 26 to modulation unit 28. In addition, modulation unit 28 may receive information indicative of the current or voltage level of a filtered power output being transmitted at link 14. Based on the information received from feedback control unit 26, modulation unit 28 may generate a driver control signal (e.g., a PWM based signal, a PDM based signal, or a signal based on some other modulation technique) for causing driver 40 to control switches 30 at die 22. Modulation unit 28 may output the drive control signal to driver 40. The driver control signal may cause driver 40 to output a command that passes over link 17B, from die 20 to die 22, for causing switches 30 to transition between operating in an on-state and an off-state.

From die 20, power converter 4 may control the one or more switches 32 of power stage 34 that are located on die 20 of power converter 4 based at least in part on the current level detected at switches 32 at die 20. For example, based on the information received from feedback control unit 26, modulation unit 28 may generate a driver control signal (e.g., a PWM based signal, a PDM based signal, or a signal based on some other modulation technique) for causing driver 42 to control switches 32 at die 20. Modulation unit 28 may output the drive control signal to driver 42. The driver control signal may cause driver 42 to output a command that passes over link 16E (e.g., contained within die 20) for causing switches 32 to transition between operating in an on-state and an off-state.

Figure 5A:
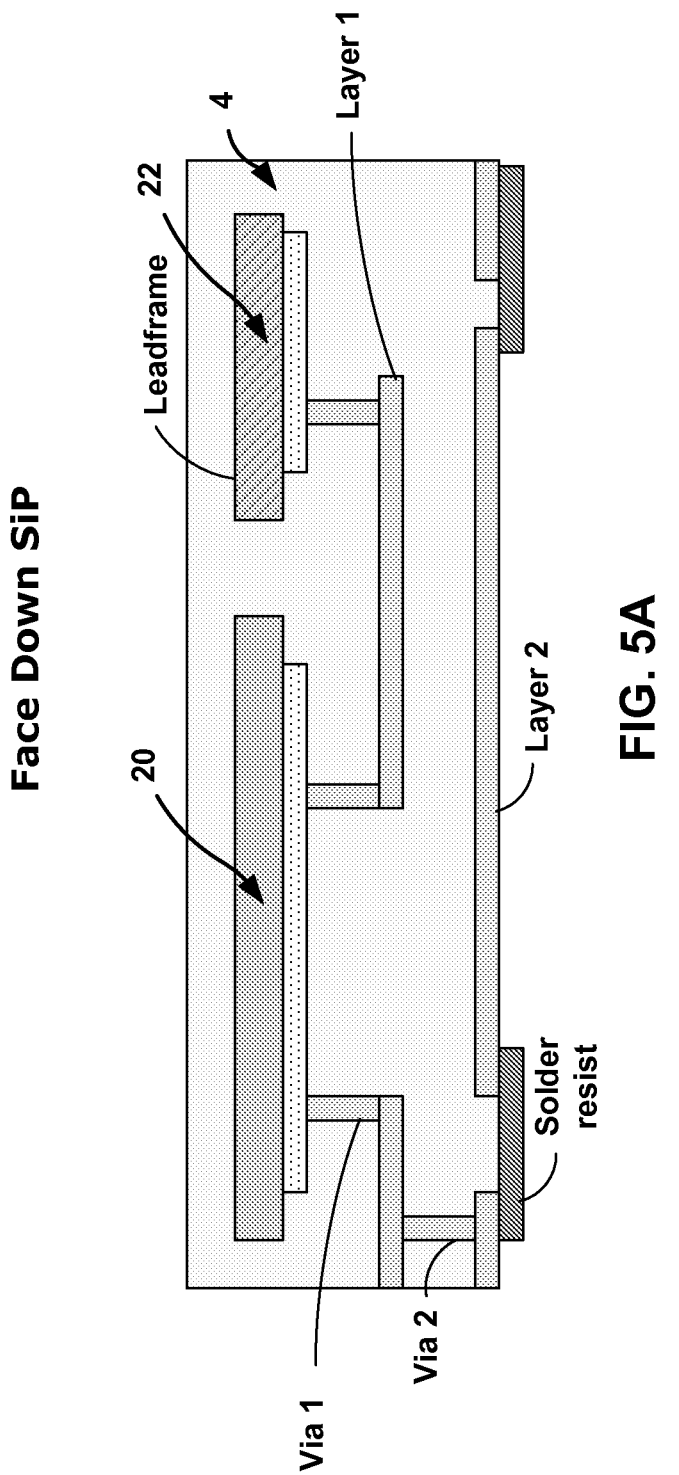
FIGS. 5A and 5B are circuit diagram illustrating cross sections of the example power converter shown in FIG. 2.
Figure 5B:
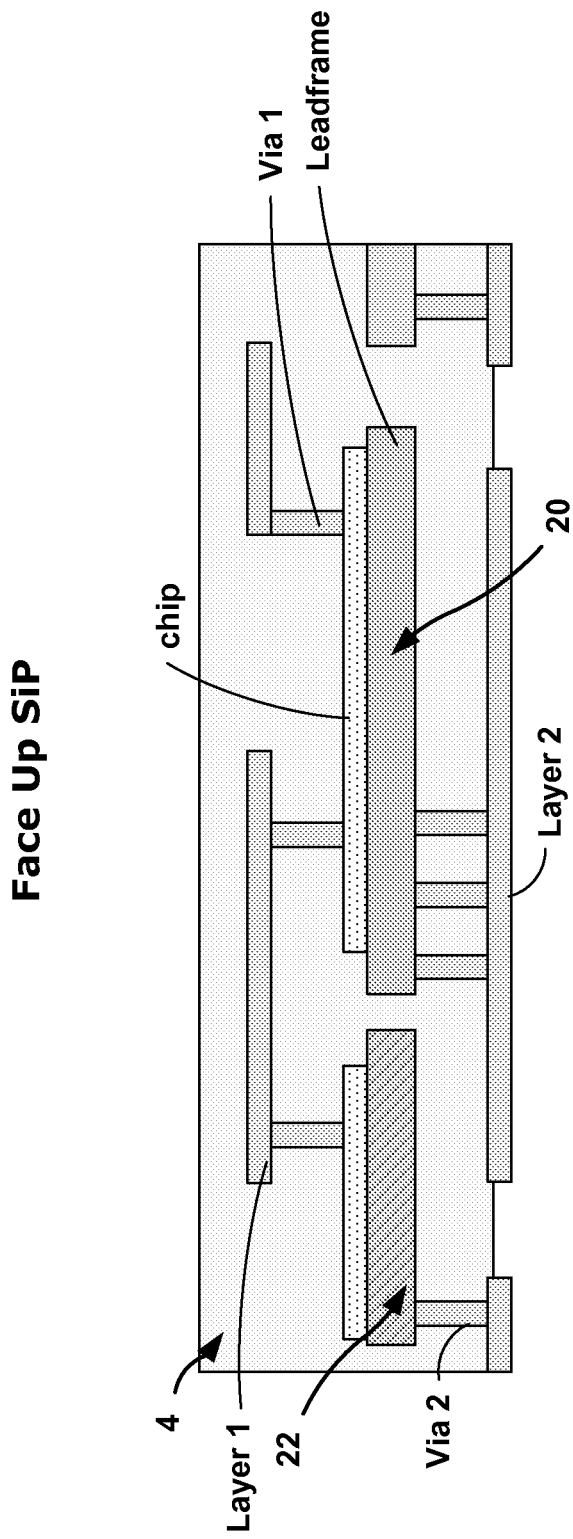

FIGS. 5A and 5B are circuit diagram illustrating cross sections of power converter 4 of FIG. 2. For example, FIG. 5A shows a "face down" SiP configuration of power converter 4 of FIG. 2, including cross sectional views of dies 20 and 22. FIG. 5B shows a "face up" SiP configuration of power converter 4 of FIG. 2, also including cross sectional views of dies 20 and 22.

With only having two dies, die 20 and die 22, power converter 4 can fit into a smaller SiP package size than other SiP power converters. For instance, other SiP power converters may include the high-side switches of a power stage on one die, the low-side switches on another die, and driver/logic and feedback control circuitry on one or more additional dies. In any case, some converters may require a minimum package size of approximately forty-nine square millimeters (i.e., seven millimeters by seven millimeters) to contain more than two dies.

Conversely, by using only two dies, the components of converter 4 can fit within a smaller package size. In some examples, converter 4 can fit within a package size that is less than forty-nine square millimeters and is approximately thirty-six square millimeters (i.e., six millimeters by six millimeters). With a smaller package size than some other power converters, the manufacturing cost to produce converter 4 is also cheaper than some other converters. A SiP power converter according to these techniques and circuits can, not only fit within a smaller package size that costs less to produce than some other converters, but the SiP power converter according to these circuits and techniques can operate more efficiently and provide a more controlled and accurate power output than some converters by using FET or SFET type switches at one die while simultaneously using highly accurate sense-FET current sensing at the other die.

Clause 1. A power converter comprising: a first die including one or more first switches coupled to a switching node of a power stage; and a second die including: one or more second switches coupled to the switching node of the power stage, and a controller unit configured to control the one or more first switches and the one or more second switches of the power stage to produce a power output at the switching node of the power stage.

Clause 2. The power converter of clause 1, wherein the one or more first switches comprise one or more high-side switches of a half-bridge of the power stage and the one or more second switches comprise one or more low-side switches of the half-bridge of the power stage.

Clause 3. The power converter of any of clauses 1-2, wherein the one or more second switches comprise one or more high-side switches of a half-bridge of the power stage and the one or more first switches comprise one or more low-side switches of the half-bridge of the power stage.

Clause 4. The power converter of any of clauses 1-3, wherein the second die further includes a feedback control unit configured to detect a current level at the one or more second switches of the power stage, wherein the controller unit is further configured to control the one or more first switches and the one or more second switches of the power stage based at least in part on the current level detected by the feedback control unit.

Clause 5. The power converter of clause 4, wherein the feedback control unit is further configured to detect the current level at the one or more second switches based on a sense-FET current sensing signal.

Clause 6. The power converter of clause 5, wherein the second die further includes: one or more sense lines contained to the second die that couple the feedback control unit to the one or more second switches of the power stage, the one or more sense lines being configured to transmit information associated with a current or voltage level of the power stage to the feedback control unit.

Clause 7. The power converter of clause 6, wherein the one or more sense lines are further configured to transmit a sense-FET current sensing signal associated with a current level detected at the one or more second switches to the feedback control unit Clause 8. The power converter of any of clauses 1-7, wherein the feedback control unit is further configured to detect a voltage or current level of a power output of the power converter, and wherein the controller unit is further configured to control the one or more first switches and the one or more second switches of the power stage based at least in part on the voltage or current level of the power output detected by the feedback control unit.

Clause 9. The power converter of any of clauses 1-8, wherein the first die is a FET or SFET type die.

Clause 10. The power converter of any of clauses 1-9, wherein the one or more first switches are SFET type switches.

Clause 11. The power converter of any of clauses 1-10, wherein the second die is a CMOS type die.

Clause 12. The power converter of any of clauses 1-11, wherein the one or more second switches are CMOS type switches.

Clause 13. The power converter of any of clauses 1-12, wherein the second die further includes at least one first driver configured to control the one or more first switches and at least one second driver further configured to control the one or more second switches.

Clause 14. The power converter of any of clauses 1-13, wherein the power converter comprises a step-down converter, wherein the power output comprises at a first voltage level that does not exceed a second voltage level of a power input received at the half bridge.

Clause 15. The power converter of any of clauses 1-14, wherein the power converter comprises a step-up converter, wherein the power output comprises a first voltage level that meets or exceeds a second voltage level of a power input received at the half bridge.

Clause 16. The power converter of any of clauses 1-15, wherein the controller unit is further configured to output at least one of a pulse-density-modulation signal, a pulse width modulation signal, and a pulse frequency modulation signal for controlling the one or more first switches and the one or more second switches of the power stage.

Clause 17. The power converter of any of clauses 1-16, wherein the power stage comprises a single phase half-bridge, wherein the one or more first switches comprise a single high-side switch of the single phase half-bridge and the one or more second switches comprise a single low-side switch of the single phase half-bridge.

Clause 18. The power converter of any of clauses 1-17, wherein the power stage comprises a multiple phase half-bridge, wherein the one or more first switches comprise two or more high-side switches of the multiple phase half-bridge and the one or more second switches comprise two or more low-side switches of the multiple phase half-bridge.

Clause 19. A method comprising: detecting, by a feedback control unit at a second die of a power converter, a current level at one or more second switches at the second die of the power converter, the one or more second switches being coupled to one or more first switches at a first die of the power converter at a switching node of a power stage; controlling, by a controller unit at the second die, the one or more first switches of the power stage at the first die based at least in part on a driver signal, wherein the driver signal is based at least in part on the current level detected at the one or more second switches at the second die; and controlling, by the controller unit at the second die, the one or more second switches of the power stage at the second die based at least in part on the driver signal.

Clause 20. A power converter comprising: means for detecting a current level at one or more second switches at a second die of a power converter, the one or more second switches being coupled to one or more first switches at a first die of the power converter at a switching node of a power stage; means for controlling, from the second die, the one or more first switches of the power stage at the first die based at least in part on a driver signal, wherein the driver signal is based at least in part on the current level detected at the one or more second switches at the second die; and means for controlling, from the second die, the one or more second switches of the power stage at the second die based at least in part on the driver signal.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

What is claimed is:
1. A power converter comprising:
 a FET or SFET type die including one or more FET or SFET type switches coupled to a switching node of a power stage; and
 a CMOS type die including:
  one or more CMOS type switches coupled to the switching node of the power stage;
  one or more sense lines contained to the CMOS type die to prevent electromagnetic interference associated with the one or more FET or SFET type switches of the FET or SFET type die, the one or more sense lines being configured to transmit a sense-FET current sensing signal associated with the one or more CMOS type switches; and
  a controller unit configured to control the one or more FET or SFET type switches and the one or more CMOS type switches of the power stage based at least in part on the sense-FET current sensing signal that is transmitted by the one or more sense lines to produce a power output at the switching node of the power stage.

2. The power converter of claim 1, wherein the one or more FET or SFET type switches comprise one or more high-side switches of a half-bridge of the power stage and the one or more CMOS type switches comprise one or more low-side switches of the half-bridge of the power stage.

3. The power converter of claim 1, wherein the one or more CMOS type switches comprise one or more high-side switches of a half-bridge of the power stage and the one or more FET or SFET type switches comprise one or more low-side switches of the half-bridge of the power stage.

4. The power converter of claim 1,
 wherein the CMOS type die further includes a feedback control unit configured to detect a current level at the one or more CMOS type switches of the power stage based at least in part on the sense-FET current sensing signal that is transmitted by the one or more sense lines,
 wherein the controller unit is further configured to control the one or more FET or SFET type switches and the one or more CMOS type switches of the power stage based at least in part on the current level detected by the feedback control unit.

5. The power converter of claim 4,
 wherein the feedback control unit is further configured to detect a voltage or current level of a power output of the power converter, and wherein the controller unit is further configured to control the one or more FET or SFET type switches and the one or more CMOS type switches of the power stage based at least in part on the voltage or current level of the power output detected by the feedback control unit.

6. The power converter of claim 1, wherein the CMOS type die further includes at least one first driver configured to control the one or more FET or SFET type switches and at least one second driver further configured to control the one or more CMOS type switches.

7. The power converter of claim 1, wherein the power converter comprises a step-down converter, wherein the power output comprises at a first voltage level that does not exceed a second voltage level of a power input received at the half bridge.

8. The power converter of claim 1, wherein the power converter comprises a step-up converter, wherein the power output comprises a first voltage level that meets or exceeds a second voltage level of a power input received at the half bridge.

9. The power converter of claim 1, wherein the controller unit is further configured to output at least one of a pulse-density-modulation signal, a pulse width modulation signal, and a pulse frequency modulation signal for controlling the one or more FET or SFET type switches and the one or more CMOS type switches of the power stage.

10. The power converter of claim 1, wherein the power stage comprises a single phase half-bridge, wherein the one or more FET or SFET type switches comprise a single high-side switch of the single phase half-bridge and the one or more CMOS type switches comprise a single low-side switch of the single phase half-bridge.

11. The power converter of claim 1, wherein the power stage comprises a multiple phase half-bridge, wherein the one or more FET or SFET type switches comprise two or more high-side switches of the multiple phase half-bridge and the one or more CMOS type switches comprise two or more low-side switches of the multiple phase half-bridge.

12. The power converter of claim 1, wherein the one or more CMOS type switches comprise current sense-FET current sensing circuitry configured to generate the sense-FET current sensing signal associated with the one or more CMOS type switches.

13. The power converter of claim 12, wherein the current sense-FET current sensing circuitry is further configured to generate the sense-FET current sensing signal associated with the one or more CMOS type switches without using a charge pump.

14. A method comprising:
  detecting, by a feedback control unit at a CMOS type die of a power converter, a current level at one or more CMOS type switches at the CMOS type die of the power converter based on a sense-FET current sensing signal associated with the one or more CMOS type switches that is being transmitted via one or more sense lines contained to the CMOS type die, wherein:
    the one or more sense lines are contained to the CMOS type die to prevent electromagnetic interference associated with one or more FET or SFET type switches at a FET or SFET type die of the power converter; and
    the one or more CMOS type switches are coupled to the one or more FET or SFET type switches at the FET or SFET type die of the power converter at a switching node of a power stage of the power converter;
  controlling, by a controller unit at the FET or SFET type die, the one or more FET or SFET type switches of the power stage at the FET or SFET type die based at least in part on a driver signal, wherein the driver signal is based at least in part on the current level detected at the one or more CMOS type switches at the CMOS type die; and
  controlling, by the controller unit at the CMOS type die, the one or more CMOS type switches of the power stage at the CMOS type die based at least in part on the driver signal.

15. The method of claim 14, wherein the one or more CMOS type switches comprise current sense-FET current sensing circuitry configured to generate the sense-FET current sensing signal associated with the one or more CMOS type switches.

16. The method of claim 15, wherein the current sense-FET current sensing circuitry is further configured to generate the sense-FET current sensing signal associated with the one or more CMOS type switches without using a charge pump.

17. A power converter comprising:
  means for detecting a current level at one or more CMOS type switches at a CMOS type die of a power converter based on a sense-FET current sensing signal associated with the one or more CMOS type switches that is being transmitted via one or more sense lines contained to the CMOS type die, wherein:
    the one or more sense lines are contained to the CMOS type die to prevent electromagnetic interference associated with one or more FET or SFET type switches at a FET or SFET type die of the power converter; and
    the one or more CMOS type switches being coupled to the one or more FET or SFET type switches at the FET or SFET type die of the power converter at a switching node of a power stage of the power converter;
  means for controlling, from the CMOS type die, the one or more FET or SFET type switches of the power stage at the FET or SFET type die based at least in part on a driver signal, wherein the driver signal is based at least in part on the current level detected at the one or more CMOS type switches at the CMOS type die; and
  means for controlling, from the CMOS type die, the one or more CMOS type switches of the power stage at the CMOS type die based at least in part on the driver signal.

18. The power converter of claim 17, wherein the one or more CMOS type switches comprise current sense-FET current sensing circuitry configured to generate the sense-FET current sensing signal associated with the one or more CMOS type switches.

19. The power converter of claim 18, wherein the current sense-FET current sensing circuitry is further configured to generate the sense-FET current sensing signal associated with the one or more CMOS type switches without using a charge pump.

* * * * *